United States Patent [19]

Antipov

[11] Patent Number: 4,595,944
[45] Date of Patent: Jun. 17, 1986

[54] RESISTOR STRUCTURE FOR TRANSISTOR HAVING POLYSILICON BASE CONTACTS

[75] Inventor: Igor Antipov, Pleasant Valley, N.Y.

[73] Assignee: International Business Machines Corporation, Armonk, N.Y.

[21] Appl. No.: 566,597

[22] Filed: Dec. 29, 1983

[51] Int. Cl.$^4$ .................... H01L 27/02; H01L 29/06; H01L 27/04
[52] U.S. Cl. ........................................ 357/51; 357/20; 357/40; 357/48; 357/50; 357/85
[58] Field of Search ....................... 357/51, 40, 85, 48, 357/50, 20

[56] References Cited

U.S. PATENT DOCUMENTS

| | | | |
|---|---|---|---|
| 3,335,340 | 8/1967 | Barson et al. | 317/235 |
| 3,404,321 | 10/1968 | Kurosawa et al. | 317/235 |
| 3,465,213 | 9/1969 | Hugle | 317/235 |
| 4,463,369 | 7/1984 | Harford | 357/44 |

OTHER PUBLICATIONS

T. H. Baker et al., "Dumbbell-Type Resistance Testing Structure" IBM Technical Disclosure Bulletin, vol. 14, No. 12, May '72, p. 3707.
I. Magdo et al., "Dumbbell Resistor Test Structure", IBM Technical Disclosure Bulletin, vol. 15, No. 4, Sep. 1972, pp. 1330–1331.

Primary Examiner—Martin H. Edlow
Assistant Examiner—Terri M. Henn
Attorney, Agent, or Firm—T. Rao Coca

[57] ABSTRACT

Disclosed is a dumbbell-shaped resistor structure fabricated in a semiconductor substrate for determining the resistivity of the intrinsic base of a polysilicon base transistor. The structure includes an n-doped base region having two large parts separated by a narrow part, resembling a flattened dumbbell, each of which extends into the substrate. A p-type emitter region extends a distance into a portion of the narrow and the second large parts of the base region. An n-type reach-through region extends from the emitter region through the base region electrically isolating a portion of the narrow and second large parts of the base region from the remainder of the base region and forming an electrically continuous p-type path between the first large part of the base region and the portion of the second large part within the reach-through region.

6 Claims, 6 Drawing Figures

RESISTOR STRUCTURE FOR TRANSISTOR HAVING POLYSILICON BASE CONTACTS

FIELD OF THE INVENTION

This invention relates to a test resistor structure formed on a semiconductor wafer for determining the characteristics of the base diffusion in the process of manufacturing a bipolar transistor having polysilicon contact to the base region.

DESCRIPTION OF THE PRIOR ART

In the manufacture of integrated circuits it has become common practice to fabricate, during the manufacturing process, test structures in the kerf region (i.e., the region of the semiconductor wafer between adjacent chips which will be subsequently destroyed at the dicing stage) or at selected sites in the wafer. The test structures, which are tested automatically in-line, serve as systematic and accurate process parameter monitors during the manufacturing process, permit modeling of the integrated circuit devices and provide reliability data on the integrated circuits on the chip.

One known structure in connection with the fabrication of bipolar transistors and illustrated in FIG. 1 is the dumbbell (or dog-bone) shaped resistor. The purpose of this structure is to facilitate an accurate determination of the sheet resistance of the narrowest portion of the base region beneath the emitter and it is formed in the semiconductor wafer to have the same characteristics as the narrowest portion of the base region of the transistor. Typical prior art references which disclose the dumbbell resistor structure are U.S. Pat. No. 3,335,340 issued to Barson et al.; U.S. Pat. No. 3,404,321 issued to Kurosawa et al. and U.S. Pat. No. 3,465,213 issued to Hugle.

The dumbbell resistor structure shown in FIG. 1 consists of a p-type base region generally designated by numeral 1 diffused into a silicon semiconductor substrate and an n-type emitter 2 which overlies the base region in an overlapping relationship with a section of the base region 1. The portion of the base region 1 which lies wholly under the emitter 2, which is designated by numeral 3 in FIG. 1, is called the intrinsic base. The external regions 4 and 5 where the emitter does not overlie the base regions are known as the extrinsic base regions. The purpose of the dumbbell resistor structure is to measure the resistance of the intrinsic base portion 3. This is accomplished by applying a current between the pads 6 and 7 and sensing the voltage across the sense arms 8 and 9. Knowing the resistance R, the sheet resistivity $\rho_s$ of the intrinsic base is deduced by utilizing the known width W of the intrinsic base portion 3 and the length L between line sensing pads 8 and 9 in accordance with the relationship $R = \rho_s L/W$.

In the manufacture of transistors using a polysilicon contact to the base (also referred to herein as polysilicon base transistors), the dumbbell resistor structure shown in FIG. 1 cannot be utilized to obtain the resistivity of the intrinsic base of the transistor due to the pecularities of the process of forming the transistor. To elaborate on this point, reference is made to FIG. 2 wherein is shown the basic features of a typical polysilicon base transistor structure 10. In this example starting from a p-type substrate 11, a subcollector region 12 and isolation regions 13 are defined. Single crystal epitaxial region 14 is then deposited and recessed oxide isolation (ROI) regions 15 are formed. The reach-through region 16 contacting the subcollector region 12 is then formed by diffusion of impurities. Thereafter, using a suitable mask the structure is appropriately etched and a layer of polysilicon is deposited making contact with the single crystal silicon 14. The polysilicon layer is then heavily doped by ion implantation and, using a suitable mask, subjected to anisotropic reactive ion etching to define into polysilicon 17 overlying the base region. A silicon dioxide layer 18 and silicon nitride layer 19 are then formed. As shown in FIG. 2, the nitride layer 19, oxide layer 18 and polysilicon 17 are then reactive ion etched to produce a window (not shown in FIG. 2). Then, intrinsic base 21 is either ion implanted or diffused through this window followed by emitter diffusion through a smaller window 20 (window 20 will be of a smaller size than the window utilized for base diffusion due to some intermediate steps such as sidewall oxidation of polysilicon 17, etc.) forming the emitter region 22. A contact channel 23 to the polysilicon is then opened for making contact with the base region via the polysilicon 17.

Thus, to form a polysilicon base transistor a heavily doped polysilicon layer is utilized as the contact to the base region and to define a region of the substrate to which the emitter is confined. Consequently, if the prior art dumbbell resistor structure shown in FIG. 1, wherein the emitter is allowed to cross and extend beyond the base region, is utilized with the polysilicon base transistor structure there would result shorting of intrinsic base resistor portion by heavily doped polysilicon siderails resulting from anisotropic reactive ion etching of the polysilicon during emitter definition and an accurate determination of the resistance of the intrinsic base portion would be severely impaired. In other words, in those transistor fabrication process in which the emitter must be confined to an area which is defined by an opening in a polysilicon layer, the conventional dumbbell resistor structure cannot be utilized. The present invention overcomes these and other drawbacks of the prior art dumbbell resistor structure by means of a novel resistor structure.

It is an object of the invention to provide a resistor structure which is compatible with polysilicon base transistor fabrication processes.

It is another object of the invention to provide a resistor structure for determining the resistivity of the intrinsic base portion of a polysilicon base transistor by providing the resistor structure within the opening in the polysilicon base contact layer which is used for emitter fabrication.

SUMMARY OF THE INVENTION

In accordance with a preferred embodiment of the invention a resistor structure for determining the intrinsic base resistivity of a polysilicon base transistor comprises a semiconductor body of one conductivity type (e.g., n-type) and a first region (base region) of the opposite conductivity type (e.g., p-type) including first and second enlarged parts (contact regions) separated by an intermediate part (resistor body region) each of which extends a distance into the semiconductor body from a surface thereof. The resistor structure includes a second region (emitter region) of the first conductivity type (i.e., n-type) extending a distance from the surface of the semiconductor body into a portion of the intermediate and second enlarged parts of the first region. The structure further includes a third region (reach-through region) of the first conductivity type (i.e., n-type) extending from the second region (emitter region) through the underlying first region thereby forming portions of the intermediate and second enlarged parts of the first region which are electrically isolated from the remainder of those parts of the first region and thereby forming an electrically continuous path of the opposite conductivity type (p-type) between the first enlarged part of the first region and the portion of the second enlarged part within the third region which is contiguous with the semiconductor body surface.

BRIEF DESCRIPTION OF THE DRAWINGS

The foregoing and other objects, features and advantages of the invention will be apparent from the following more particular description of a preferred embodiment of the invention, as illustrated in the accompanying drawings wherein.

DETAILED DESCRIPTION OF THE PREFERRED EMBODIMENT

Figure 3:
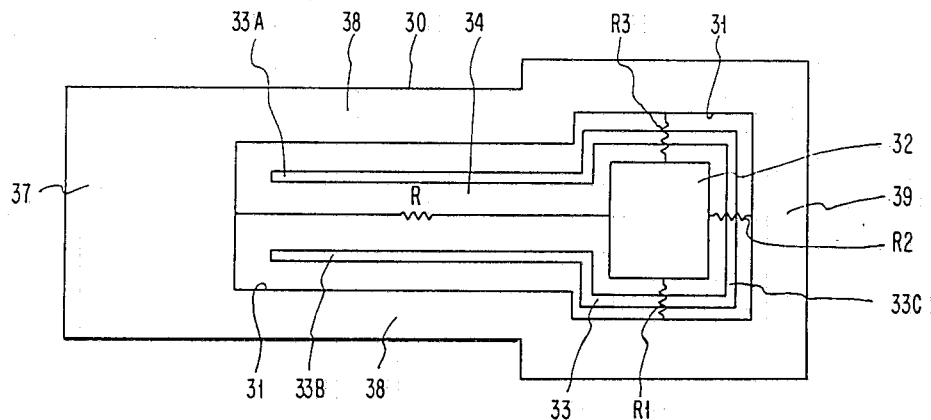
FIG. 3 is a plan view of the resistor structure in accordance with the invention showing in a close-up the details of the structure prior to opening of contacts to polysilicon and to forming metal contacts.

Referring now to the drawings, in particular FIGS. 3-6, there is represented diagrammatically in FIG. 3 the top plan view of the resistor structure for determining the resistivity of the intrinsic base portion of a polysilicon base transistor. In FIG. 3 a portion of the doped polysilicon layer which is utilized for contacting the extrinsic base of the transistor and as a mask for the formation of the emitter is shown and designated by numeral 30. The polysilicon layer 30 is provided with an elongated opening 31 having a polysilicon island 32. It is within this opening that the resistor structure is formed simultaneously with the fabrication of the transistor. The opening 31 is formed during the same step that the emitter opening in the polysilicon for the transistor is formed. The polysilicon island 32 serves as one of the current and/or voltage contacts (the inside contact) for measuring the resistance of the resistor structure. The other current and/or voltage contact (outside contact) is not shown in FIG. 3, but it could be any point in the polysilicon body 30. One convenient location for establishing the outside contact is the general area designated by numeral 37 in FIG. 3.

Within the opening 31 is provided a narrow region of reach-though diffusion 33 which not only extends along the elongated portion of the opening, but also essentially encircles the polysilicon island 32. The reach-through diffusion 33 is of the same conductivity type as the emitter, but of opposite conductivity type as the base region of the transistor. The function of the reach-through diffusion region 33 having the unique configuration specified is to cut the intrinsic base and channel the current, during resistance measurement, to the elongated area 34 between the inside and outside contacts 32 and 37, respectively. Another function of the reach-through diffusion 33 is to define the well-defined rectangular area 34 which enables a straight forward computation of resistivity. If the reach-through diffusion region 33 were not present the resistance R of the area 34 cannot be determined by applying current between the inside and outside contacts 32 and 37, respectively, and measuring the voltage across these contacts since in this situation the area 34 would be bypassed by the current due to the availability of low resistance paths designated by resistors $R_1$, $R_2$, $R_3$ in FIG. 3 between the inside and outside contacts corresponding to the various shorter paths between these contacts.

Figure 1:
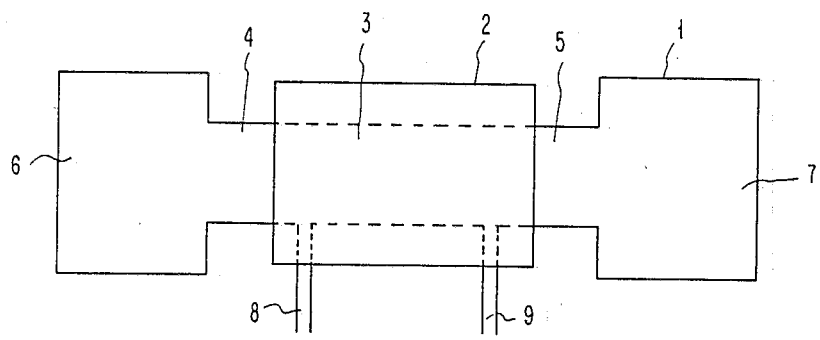
FIG. 1 is a plan view of a dumbbell resistor structure in accordance with the prior art for testing the base resistivity of a non-polysilicon base transistor.
Figure 2:
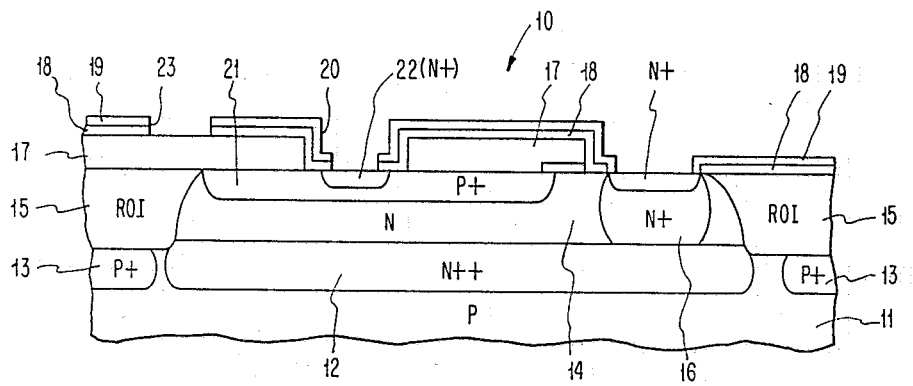
FIG. 2 is a cross-sectional view showing the essential features of a conventional polysilicon base transistor structure.

The reach-through diffusion region 33 having the configuration shown in FIG. 3 is not formed in the active area of the transistor structure, but is limited to the area of the wafer where the resistor structure is fabricated. However, the reach-through diffusion region 33 forming step is not an additional process step in the resistor structure fabrication since the reach-through portion 33 can be formed in the same step and utilizing same mask used for forming the reach-through region for collector contact 16 in the transistor structure (FIG. 2).

Figure 4:
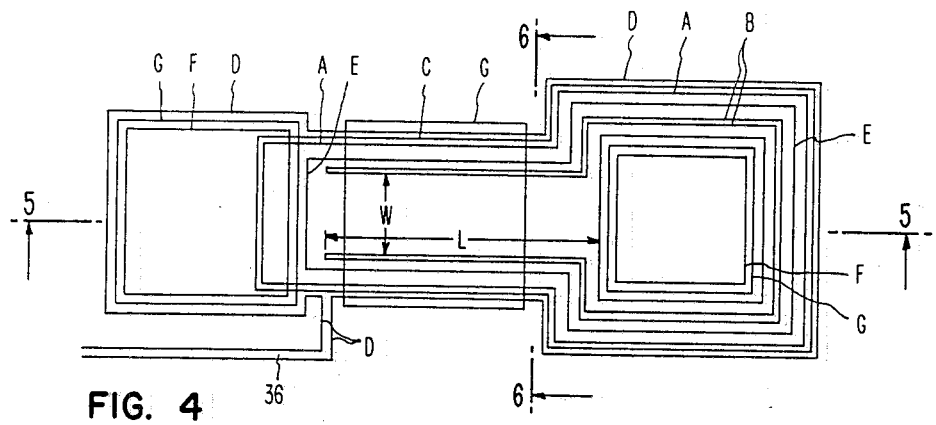
FIG. 4 is a plan view of the resistor structure in accordance with the invention including the various mask levels used in the fabrication of the resistor structure.

The width W of the resistor structure in the space between the two arms 33A and 33B of the reach-through diffusion region 33 and the length L is the distance between the inside and outside contacts to the polysilicon overlying the extrinsic base as illustrated in FIG. 4.

In FIG. 4 is shown in a plan view the various essential masks used to fabricate the resistor structure of the invention. Masks such as those utilized while forming the subcollector, isolation regions are not shown in FIG. 4. Referring to FIG. 4, the mask identified as A in the recessed oxide isolation (ROI) mask which is used to form the ROI region 35 shown in cross-sectional representation in FIGS. 5 and 6. Mask B is the reach-through mask which is used to form the reach-through diffusion region 33 (FIGS. 3 and 6) by implanting or diffusing into the substrate impurities of the same conductivity type as those used for forming the emitter regions. Mask C is the mask which defines the area of the single crystal silicon substrate in which the polysilicon will contact the single crystal. This mask defines the body of the resistor including all the contacts. Mask D is used to define the outside shape of the polysilicon layer. In other words, mask D defines the shape of the polysilicon in the intrinsic and extrinsic base regions including the areas where metal contacts to the polysilicon will be subsequently established. Mask D also defines the voltage arm 36 which will be used during the intrinsic base resistance measurement. Mask E defines the opening (designated as 31 in FIG. 3) in the polysilicon which will be used for forming the intrinsic base and emitter of the transistor and the polysilicon island (designated as 32 in FIG. 3) in contact with the extrinsic base. In other words, mask E is used to cut out (by reactive ion etching) in the polysilicon a rectangular portion corresponding to the intrinsic base/emitter region and a ring-shaped portion encircling the polysilicon island 32 (FIG. 3). It is through this rectangular opening and the ring-shaped portion that the intrinsic base and emitter regions are implanted or diffused into the substrate. Mask F represents the mask that is utilized to form openings in the various insulating layers overlying the polysilicon to expose the polysilicon for contact purposes. Finally, mask G is used, for example, for forming metal contacts in the openings formed by mask F.

Figure 6:
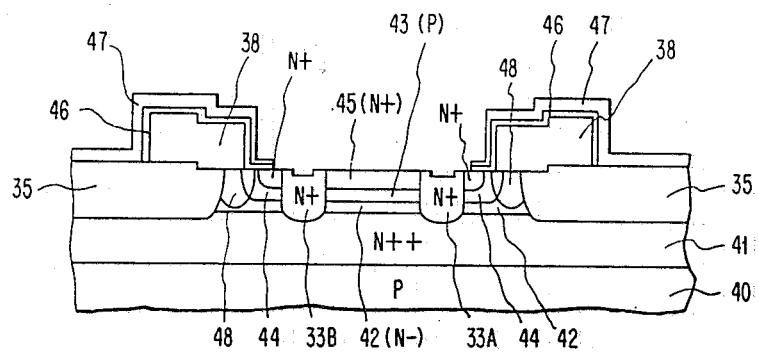
FIG. 6 is a sectional view of the resistor structure shown in FIG. 4 taken on the line 6—6.

Reference is now made to FIG. 6 which shows in a cross-sectional representation the resistor structure of the invention which is fabricated using the mask set illustrated in FIG. 4. The resistor structure consists of a p-type monocrystalline silicon semiconductor substrate 40 which has preferably a resistivity of 10–20 ohms centimeter. Overlying the substrates is an n-type subcollector 41, an epitaxially grown n-type silicon layer 42 of a thickness of about 1.2–2.0 micrometers and ROI regions 35-35. Formed atop the epitaxial layer 42 is the base diffusion consisting of an intrinsic portion 43 and portions 44-44 each of which is a combination of intrinsic and extrinsic base portions. The primary function of the present resistor structure is to measure the resistance of the intrinsic base portion 43. The base diffusion 43-44 is of p-type. Overlying the p-type base diffusion layer is an n-type emitter diffusion layer 45 which is coextensive with the entire intrinsic base portion 43 and portions of the intrinsic/extrinsic base portions 44-44. The resistor structure includes n-type reach-through regions 33A and 33B extending from the emitter diffusion layer 45 and going into the subcollector region 41 via the base diffusion layer 43-44 and the epitaxial layer 42. The reach-through regions 33A and 33B electrically separate the intrinsic base portion 43 from the intrinsic/extrinsic base portion 44. The resistor structure shown in FIG. 6 also includes a p-type polysilicon 38 making contact with the intrinsic/extrinsic base portions 44. Polysilicon 38 is provided with a layer of silicon dioxide 46 and silicon nitride 47. Also shown in FIG. 6 are p-type diffusion regions which are formed in integral relationship with the intrinsic/extrinsic base portions 44.

Figure 5:
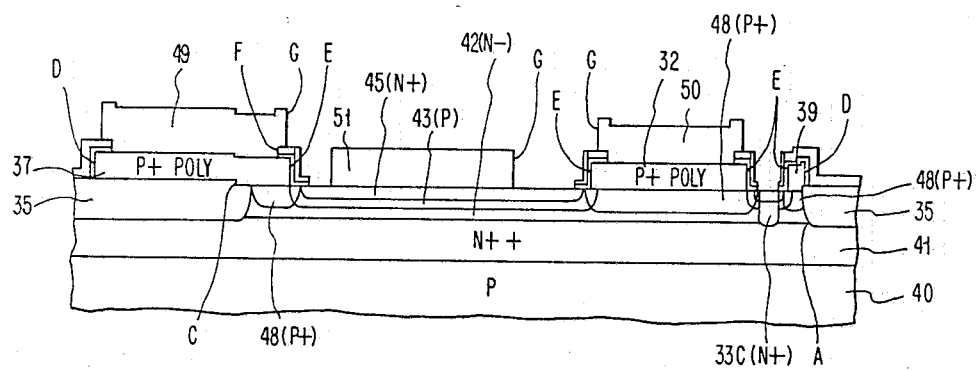
FIG. 5 is a sectional view of the FIG. 4 structure taken on the line 5—5.

Reference is now made to FIG. 5 which shows the resistor structure of FIG.. 4 in another cross-sectional representation taken along the line 5—5. For completeness of correspondence between FIGS. 4 and 5, identification is made in FIG. 5 of the various masks which define the identified feature of the resistor. In this figure, 49 and 50 represent the metal layers making electrical contact to the outside and inside polysilicon base contacts 37 and 32, respectively. 51 represents the metal contact to the emitter 45. FIG. 5 also shows the reach-through diffusion 33C which electrically separates the polysilicon island 32 from the outside polysilicon 39.

To measure the resistance of the intrinsic base portion 43 (FIGS. 3–6), the conventional four-point technique can be utilized. A known current is forced through the intrinsic base portion 43 by connecting the inside and outside polysilicon contacts 32 and 37, respectively, to a current source. Since the reach-through diffusion 33 comprising the segments 33A, 33B and 33C effectively serves as a trench electrically separating the inside portion 34 of the base diffusion region from the outside portion 38-39, current is channeled to the inside rectangular portion 34. The resistance R of the inside portion 34 is determined by measuring the potential difference V between the polysilicon contact 32 and the voltage arm 36 and using R=V/I. Once the resistance is known, the resistivity of the base rectangular portion 43 can be calculated using the width W and length L of this rectangular portion.

Thus, there has been described a resistor structure which enables determination of the intrinsic base resistivity of polysilicon base transistor structures. The resistor structure is suitable for incorporation in all those polysilicon base transistor fabrication processes which require the emitter to be confined to an opening in the polysilicon base contact. As is required of any test resistor structure, the present structure is formed using the same mask set and same process steps which are used for the transistor fabrication.

The resistor structure of the invention has several advantages. It enables a systematic and accurate monitoring and control of the polysilicon base transistor process parameters. It permits better device modeling verification. The structure makes available of the resistivity measurement at an early stage of the transistor fabrication without any in-line test cost or turn-around time. Finally, the resistor structure provides data of use for statistical analysis to verify or obtain improved knowledge of process bias, lot-to-lot variation, overall image tolerance (to compare with ground rule specifications).

Although the resistor structure of the invention has been described in the context of utilizing as a test resistor to monitor the process of fabrication of a polysilicon base transistor, the structure is not so limited in its use. For example, the present structure can be used as a resistor per se for coupling with various active and passive integrated circuit elements.

While the invention has been illustrated and described with respect to a preferred embodiment thereof, it is to be understood that the invention is not limited to the precise construction herein disclosed and that right is reserved to all changes and modifications within the spirit and scope of the invention.

What is claimed is:

1. A resistor structure comprising:
   a semiconductor layer of a first conductivity type;
   a first region of the opposite conductivity type extending a distance into said layer from a surface thereof, said region including first and second sections separated by an intermediate section;
   a second region of the first conductivity type extending a distance from said surface into a portion of the intermediate and second sections of the first region; and
   a third region of the first conductivity type extending from the second region through the underlying first region thereby electrically separating portions of the intermediate and second sections of the first region interior to said third region from the remainder of the intermediate and second sections of the first region and, thereby, forming an electrically continuous path of the opposite conductivity type between the first section of the first region and the portion of said second section within the third region and contiguous with said portion of the intermediate part within said third region.

2. The structure as recited in claim 1 wherein said first conductivity type is n-type.

3. The structure as in claim 2 wherein said semiconductor layer is silicon.

4. The structure as recited in claim 3 further comprising p-type polysilicon contacts for electrically contacting said first section and the portion of the second section within said third region.

5. A resistor structure comprising:
   an n-type single crystal silicon semiconductor layer formed on a substrate;

a first region of p-type conductivity extending a distance into the silicon layer from a surface thereof, said first region including a first section and a second slightly enlarged section separated from the first section by an intermediate section;

a second region of n-type conductivity extending a distance from said surface into a portion of said intermediate and second enlarged sections of the first region;

an open-loop shaped third region of n-type conductivity extending from the second region through the underlying first region, thereby, forming portions of said intermediate and second enlarged sections of the first region interior to said third region which are in effect electrically isolated from the remainder of the intermediate and second enlarged sections of the first region and, thereby, forming an electrically continuous path of p-type conductivity between said first section of the first region and the portion of said second enlarged section within the third region and contiguous with said portion of the intermediate part within said third region.

6. The structure as in claim 5 wherein said continuous path is rectangular in shape, the longer dimension of said rectangular shape being the shortest distance in said contiguous portion between said first and second enlarged sections.

* * * * *